United States Patent
Lee

(10) Patent No.: US 8,970,050 B2
(45) Date of Patent: Mar. 3, 2015

(54) SEMICONDUCTOR MEMORY DEVICE INCLUDING ALIGNMENT KEY STRUCTURES

(71) Applicant: SK Hynix Inc., Icheon-si (KR)

(72) Inventor: Chang Hyun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/728,549

(22) Filed: Dec. 27, 2012

(65) Prior Publication Data

US 2014/0048948 A1    Feb. 20, 2014

(30) Foreign Application Priority Data

Aug. 17, 2012 (KR) .......................... 10-2012-0090006

(51) Int. Cl.
*H01L 29/40* (2006.01)
*H01L 21/44* (2006.01)
*H01L 23/498* (2006.01)
(Continued)

(52) U.S. Cl.
CPC ........ *H01L 23/49827* (2013.01); *H01L 21/768* (2013.01); *H01L 23/544* (2013.01); *H01L 25/0657* (2013.01); *H01L 23/481* (2013.01); *H01L 2924/0002* (2013.01);
(Continued)

(58) Field of Classification Search
CPC ................... H01L 2225/06541; H01L 23/481; H01L 23/522; H01L 23/5226; H01L 23/525; H01L 23/528; H01L 23/538; H01L 23/5389; H01L 24/01; H01L 24/76; H01L 27/14636; H01L 2221/68359; H01L 2224/82; H01L 2924/18162; H01L 27/108; H01L 27/00; H01L 2224/821; H01L 2224/73265; H01L 2224/32145; H01L 2224/16145; H01L 25/0657; H01L 23/544; H01L 21/743; H01L 2224/81132; H01L 2225/06548; H01L 24/19; H01L 2224/10135; H01L 2224/10165

USPC ..................... 257/68–71, 225–234, 255–266, 257/296–309, 314–326, 390, 905–908, 797, 257/E29.17, E21.645–E21.694, 257/E27.084–E27.097, E21.646–E21.66, 257/E21.662, E21.666–E21.678, E27.075, 257/E27.078, E29.3–E29.309, 257/E27.098–E27.101, E27.077, 257/E21.179–E21.182, E21.209–E21.21, 257/E21.422, E21.423, E21.679–E21.694; 438/128, 239, 396, 397, 398, 523, 533, 438/571, 597, 618, 620, 621, 637, 653, 666, 438/672, 674, 720, 723, E21.507, E21.257, 438/E21.576, E21.657, E21.583, E21.649

See application file for complete search history.

(56) References Cited

U.S. PATENT DOCUMENTS

| 2003/0174879 A1 | 9/2003 | Chen |
| 2007/0004084 A1* | 1/2007 | Matsui .......................... 438/106 |

(Continued)

FOREIGN PATENT DOCUMENTS

| KR | 1020100019908 A | 2/2010 |
| KR | 1020110131702 A | 12/2011 |

*Primary Examiner* — Colleen A Matthews
*Assistant Examiner* — Junaiden Mirsalahuddin
(74) *Attorney, Agent, or Firm* — Kilpatrick Townsend & Stockton LLP

(57) ABSTRACT

A semiconductor memory device includes a first chip and a second chip connected to the first chip physically and electrically, wherein the first chip and the second chip are coupled by through silicon vias (TSVs) formed in a first region, and the first chip and the second chip are coupled by alignment keys formed in second regions.

9 Claims, 3 Drawing Sheets

(51) Int. Cl.
  *H01L 21/768* (2006.01)
  *H01L 23/544* (2006.01)
  *H01L 25/065* (2006.01)
  *H01L 23/48* (2006.01)

(52) U.S. Cl.
  CPC .......... *H01L 2223/5442* (2013.01); *H01L 2223/54426* (2013.01); *H01L 2223/54473* (2013.01)

USPC .......... 257/777; 257/774; 257/786; 438/667; 438/669

(56) References Cited

U.S. PATENT DOCUMENTS

| 2010/0058580 | A1* | 3/2010 | Yazdani | 29/740 |
| 2011/0215457 | A1* | 9/2011 | Park | 257/686 |
| 2011/0291267 | A1 | 12/2011 | Wang et al. | |
| 2012/0164788 | A1* | 6/2012 | Ide | 438/109 |

* cited by examiner

SEMICONDUCTOR MEMORY DEVICE INCLUDING ALIGNMENT KEY STRUCTURES

CROSS-REFERENCES TO RELATED APPLICATION

The present application claims priority under 35 U.S.C. §119(a) to Korean application number 10-2012-0090006, filed on Aug. 17, 2012, in the Korean Intellectual Property Office, which is incorporated herein by reference in its entirety.

BACKGROUND

1. Technical Field

Various embodiments presented herein relate to semiconductor devices, and more particularly, to stacked semiconductor memory devices with interconnected alignment keys.

2. Related Art

The technology for stacking a plurality of semiconductor integrated circuits (ICs) is being more widely adopted, driven primarily by performance requirements and the need to reduce the footprint of integrated circuits.

A "stack" in the semiconductor technology commonly refers to two or more semiconductor chips or packages that are vertically stacked on top of one another. Using stacking techniques, for example, a semiconductor memory can be formed that has a memory capacity twice or more than the memory capacity that can be obtained with a single chip. Furthermore, the stacking of devices is advantageous in terms of a mounting area and mounting area efficiency as well as an increase of the memory capacity, and thus research and development in stacking technology is being accelerated.

A stack package can be manufactured using a method of stacking semiconductor chips and then packaging the stacked semiconductor chips, or using a method of stacking packaged semiconductor chips. The semiconductor chips of the stack package are electrically coupled to one another using metal wires or through-silicon vias (TSVs). In particular, a stack package using through-silicon vias has a structure in which the through-silicon vias are formed within the semiconductor chips and the semiconductor chips are vertically coupled to one another both physically and electrically by the through-silicon vias.

FIG. 1 shows a simplified construction of a conventional semiconductor memory device. Referring to FIG. 1, the conventional semiconductor memory device includes a TSV region at the center of a chip and alignment patterns at corners of the chip.

The alignment patterns provide directional recognition for aligning the precise position of the chip.

When a plurality of the semiconductor memory devices are stacked, a phenomenon in which the chips arc due to the downward pressure during the stacking process occurs, as shown in FIG. 2A.

In some cases, the chips tilt to or compress on one side because the chips do not maintain a horizontally level position during the chip stacking process, as shown in FIG. 2B. These phenomena become more severe as the number of chips in the stack is increased. Thus, there is a need for techniques that address such problems when stacking semiconductor devices.

SUMMARY

In an exemplary embodiment, a semiconductor memory device includes a first chip and a second chip connected to the first chip physically and electrically, wherein the first chip and the second chip are coupled by TSVs formed in a first region, and the first chip and the second chip are coupled by alignment keys formed in second regions.

In another exemplary embodiment, a semiconductor memory device includes first and second semiconductor chips stacked on top of each other. Each of the first and second semiconductor chips includes an alignment key that has a predetermined alignment pattern. The alignment key of the first semiconductor chip is connected to the alignment key of the second semiconductor chip by a plurality of through-silicon vias (TSVs). The plurality of through-silicon vias (TSVs) are arranged so as to form the alignment pattern on each of the first and second semiconductor chips.

In yet another exemplary embodiment, a method of forming a semiconductor memory device having a first semiconductor chip on top of a second semiconductor chip, includes forming first and second pluralities of through-silicon vias (TSVs), the first plurality of TSVs being connected between a central region of the first semiconductor chip and a central region of the second semiconductor chip, and the second plurality of TSVs being arranged to form one or more alignment patterns on each of the first and second semiconductor chip, the second plurality of TSVs connecting the one or more alignment patterns on the first semiconductor chip to the one or more alignment patterns on the second semiconductor chip.

In accordance with some embodiments, by forming stacked semiconductor memory devices with alignment patterns or alignment keys that are interconnected using TSVs, mechanical stress on the stacked semiconductor memory devices can be reduced.

BRIEF DESCRIPTION OF THE DRAWINGS

Features, aspects, and embodiments are described in conjunction with the attached drawings. It is understood that in the following drawings, between two stacking chips, there can be dielectric layers, which are not shown for simplicity.

DETAILED DESCRIPTION

Hereinafter, a semiconductor memory device according to exemplary embodiments of the inventive concept will be described below with reference to the accompanying drawings.

Figure 1:
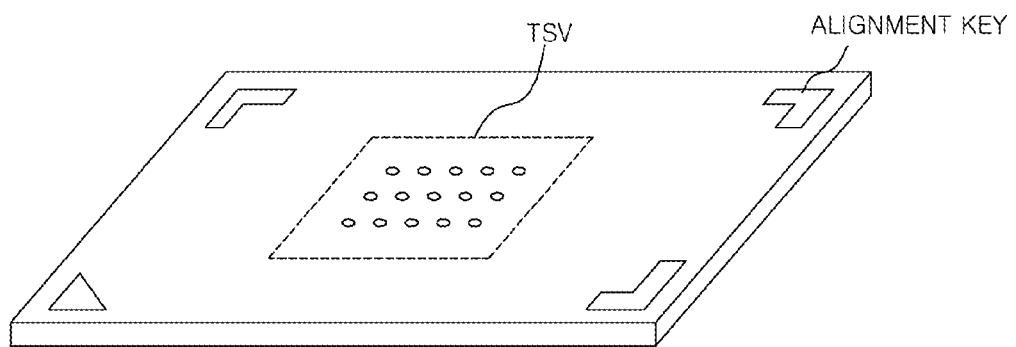
FIG. 1 shows a simplified construction of a conventional semiconductor memory device.
Figure 2A:
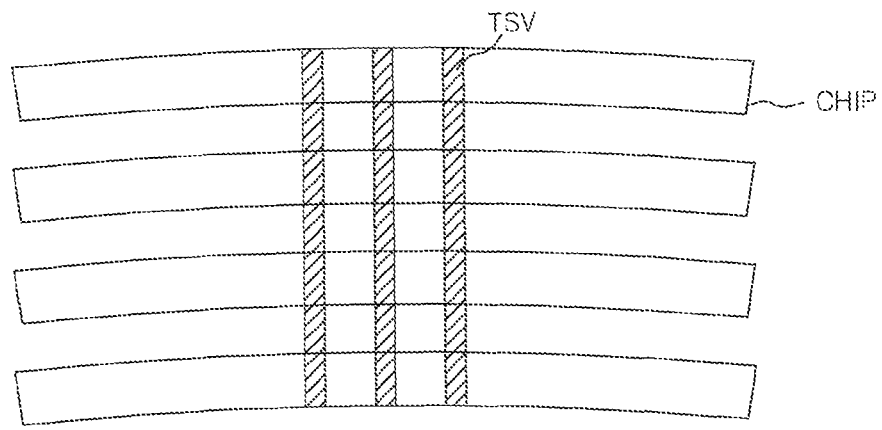
FIGS. 2A and 2B are cross-sectional views of conventional stacked semiconductor memory devices.
Figure 2B:
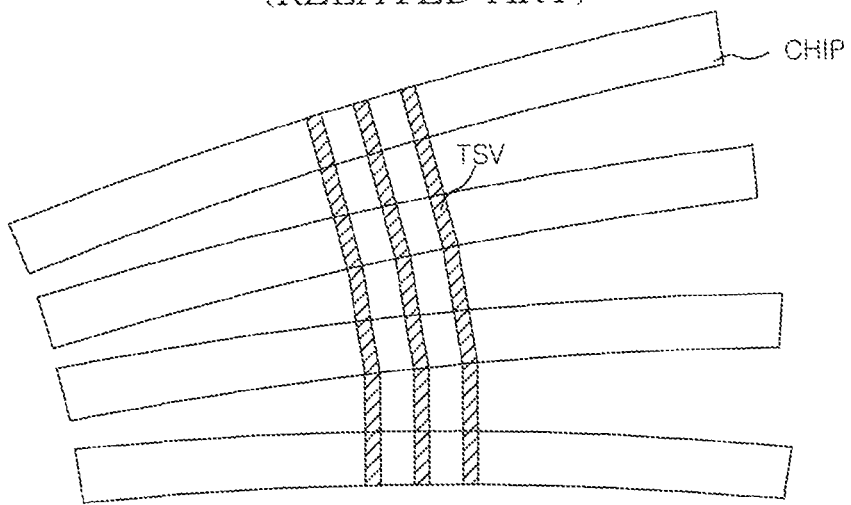
Figure 3:
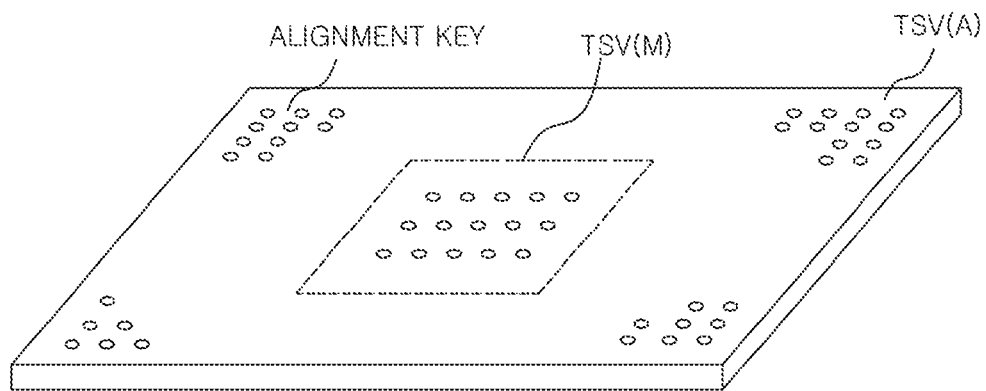
FIG. 3 shows the construction of a semiconductor memory device including alignment key structures in accordance with an exemplary embodiment.

FIG. 3 shows the construction of a semiconductor device, such as a semiconductor device, including alignment key structures in accordance with one exemplary embodiment.

Referring to FIG. 3, the semiconductor device includes a main TSV region TSV(M) in a center region of the semiconductor memory device, that is, some central region which is a region other than the corners of the semiconductor memory device and has a physical weight center. The main TSV region TSV(M) may include TSVs that extend through an internal main circuit and is a region through which electrical and physical connection between stacked semiconductor memory devices may be made.

Furthermore, sub-TSV regions TSV(A) may be included at one or more corner regions of the semiconductor memory device.

The sub-TSV regions TSV(A) in accordance with an exemplary embodiment may be configured to function as alignment keys as well as support structure for the stacked semiconductor memory devices.

The footprint of the semiconductor devices is thus reduced while the alignment accuracy in forming the semiconductor devices is increased. When forming a pattern using a photo-lithography process, a misalignment margin is insufficient due to fine patterns. Accordingly, there is a need for precise alignment accuracy.

To this end, alignment keys may be formed in the semiconductor memory device, and the chips may thus be precisely aligned while moving the chip on a wafer through various process steps.

The alignment pattern or the alignment key may provide directional recognition for aligning the precise position of the chip. In the prior art, the alignment pattern or the alignment key is formed using the top metal, and the alignment key performs the limited function of preventing misalignment of the chip. Accordingly, the shape of the alignment pattern, that is, the shape of the alignment key, has only to be formed so that it has a shape that may become a standard for identification.

In accordance with an exemplary embodiment, an alignment key that forms an alignment pattern may function to couple and provide structural support between an upper semiconductor memory device and a lower semiconductor memory device using TSV and also may serve as an alignment standard for a chip. Accordingly, the chips can be aligned, and the impact of mechanical stress during the stacking process can be reduced. The alignment key can have a specific shape depending on the shape of the corner of a chip, and as such, the alignment key is not intended to be limited to a particular shape. The alignment key is described in more detail next.

As described above, some of the internal circuits in the main TSV region TSV(M) at the center of the semiconductor memory device may include TSVs, so that the TSVs may function to couple and stably support an upper semiconductor memory device and a lower semiconductor memory device.

Meanwhile, alignment keys formed of TSVs may be located at one or more corner regions of each chip, such that the alignment keys can also provide structural support. Although FIG. 3 shows TSVs in all four corner regions, TSVs can be included in less than all four corner regions. For example, TSVs may be included in only two diagonally-facing corner regions. Also, the TSVs in each corner region are formed so as to form a particular alignment pattern. For example, as shown in FIG. 3, the TSVs in one corner region form a triangle pattern, and in other corner regions form an L pattern. It is noted that these alignment patterns are exemplary and other alignment patterns can also be formed by TSVs.

In addition to functioning as alignment keys and support structure, the sub-TSV regions TSV(A) may also function as power (VDD or VSS) TSVs, and thus the power mesh of the semiconductor memory device can be improved.

That is, with TSVs in the sub-TSV regions TSV(A) serving as power TSVs, in addition to the power TSVs in the main TSV region TSV(M) the electrical characteristics of the semiconductor memory device can be improved because the overall power performance of the semiconductor memory device is reinforced.

Figure 4:
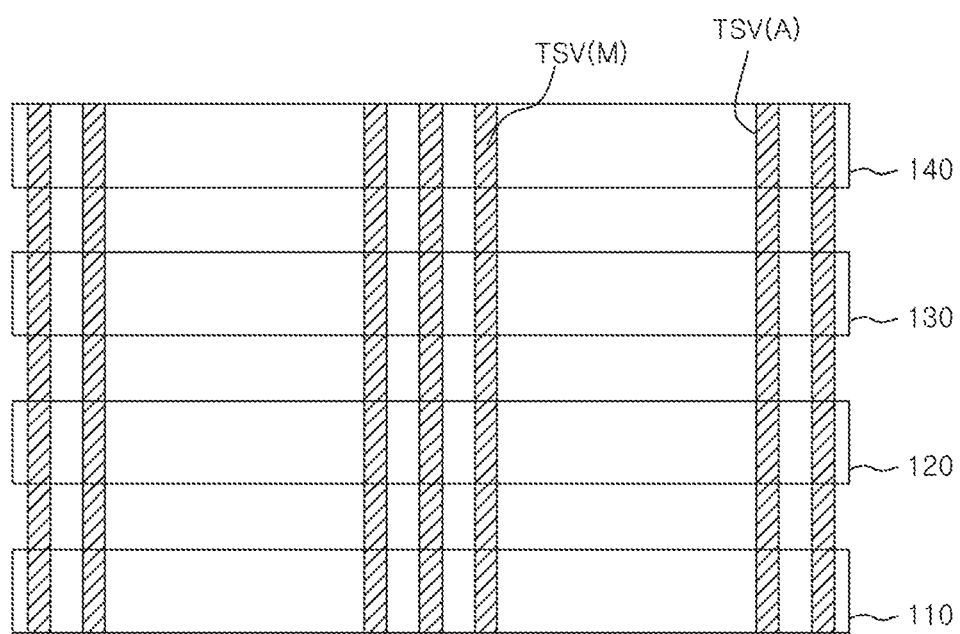
FIG. 4 is a cross-sectional view of stacked semiconductor memory devices according to FIG. 3.

FIG. 4 is a cross-sectional view of stacked semiconductor memory devices according to FIG. 3.

With reference to FIG. 4. A first chip 110 and a second chip 120 are electrically and physically coupled by the main TSV region TSV(M).

In the prior art, with insufficient support in corner regions, these regions become exposed to mechanical stress due to physical force generated during the stacking process. The mechanical stress can cause arcing of the semiconductor memory devices or tilting to one side, which if severe enough, can cause malfunction.

In accordance with one exemplary embodiment, the center regions of the semiconductor memory devices are supported by the main TSV region TSV(M), and the corner regions of the semiconductor memory devices are reinforced and supported by the sub-TSV regions TSV(A), thereby distributing or reducing mechanical stress during the stacking process. Accordingly, stacked semiconductor memory devices with high structural integrity can be obtained.

Furthermore, the TSVs in the sub-TSV regions TSV(A) are formed in the alignment key regions and are configured to function as alignment keys so that no separate regions need to be allocated to alignment keys. In addition, by using TSVs in the sub-TSV regions TSV(A) as power TSVs, the electrical characteristics and performance of the semiconductor memory device can be improved. In some embodiments, the TSVs in the sub-TSV regions TSV(A) may include power TSVs and/or TSVs that carry operational signals between stacked semiconductor devices.

As described above, as between the second chip 120 and a third chip 130, the center regions of the semiconductor memory devices are electrically and physically coupled by the TSVs in the main TSV region TSV(M), and the corner regions of the semiconductor memory devices can be supported and coupled by the TSVs in the sub-TSV regions TSV(A) which, may also function as alignment keys as well as power TSVs. A relation between the third chip 130 and a fourth chip 140 is similar to that between the second chip 120 and the third chip 130, and thus the description thereof is omitted. In some embodiments, chips 110, 120, 130 and 140 may be separate semiconductor substrates or dies housing similar or different types of integrated circuits. For example, one or all of the four chips may be memory dies, such as DRAMs or Flash memories. Of course, the stack is not limited to four chips. More or Less than four chips may be stacked as needed.

While the present invention has been particularly shown and described with reference to exemplary embodiments thereof, it will be understood by those of ordinary skill in the art that various changes in form and details may be made therein without departing from the spirit and scope of the present invention.

What is claimed is:
1. A semiconductor memory device comprising:
   a first semiconductor chip including a first region and a second region wherein the second region is positioned in an edge of the first semiconductor chip;
   a second semiconductor chip including a third region corresponding to the first region and a fourth region, wherein the fourth region is positioned in an edge of the second semiconductor chip which corresponds to the second region, and stacked on top of the first semiconductor chip;
   a first plurality of through-silicon vias (TSVs) formed in the first region of the first semiconductor chip and the third region of the second semiconductor chip so as to be electrically connected between the first and second semiconductor chips; and alignment keys formed in the second region of the first semiconductor chip and the fourth region of the second semiconductor chip, wherein the alignment keys are provided for aligning the first and second semiconductor chips, and the alignment keys of the first semiconductor chip are electrically connected to that of the second semiconductor chip by via patterns.

2. The semiconductor memory device according to claim 1, wherein the alignment keys are configured to receive a power voltage.

3. The semiconductor memory device according to claim 1, wherein the first and third regions are located in central regions of the first and second semiconductor chips, respectively.

4. The semiconductor memory device according to claim 1, wherein the second and fourth regions are located in corner regions of the first chip and the second chip, respectively.

5. The semiconductor memory device according to claim 1, wherein the alignment keys configured to be arranged along edges lines of the first and second semiconductor chips.

6. A semiconductor memory device comprising:

first and second semiconductor chips stacked on top of each other, each of the first and second semiconductor chips including an alignment key having a predetermined alignment pattern and a via pattern, the alignment key of the first semiconductor chip being connected to the alignment key of the second semiconductor chip by the via pattern, wherein the alignment keys are provided for aligning the first and second semiconductor chips, edges of the first and second semiconductor chips are supported by the alignment keys and the first and second alignment keys are formed to have a through-silicon via (TSV) structure.

7. The semiconductor memory device of claim 6, wherein the alignment keys are configured to receive a power voltage.

8. The semiconductor memory device of claim 6, wherein the alignment key is located in a corner region of each of the first and second semiconductor chips.

9. The semiconductor memory device of claim 8, further comprising a plurality of main TSVs formed in a central region of the first semiconductor chip and a central region of the second semiconductor chip.

\* \* \* \* \*